United States Patent
Gong et al.

(10) Patent No.: US 12,178,070 B2
(45) Date of Patent: Dec. 24, 2024

(54) FABRICATING METHOD OF DISPLAYING BASE PLATE, DISPLAYING BASE PLATE AND DISPLAYING DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Kui Gong, Beijing (CN); Zhihai Zhang, Beijing (CN); Wei Tian, Beijing (CN); Ying Qian, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 570 days.

(21) Appl. No.: 17/477,378

(22) Filed: Sep. 16, 2021

(65) Prior Publication Data

US 2022/0190292 A1    Jun. 16, 2022

(30) Foreign Application Priority Data

Dec. 10, 2020 (CN) .......................... 202011438605.0

(51) Int. Cl.
*H10K 50/844* (2023.01)
*H10K 59/12* (2023.01)
(Continued)

(52) U.S. Cl.
CPC ......... *H10K 50/844* (2023.02); *H10K 59/124* (2023.02); *H10K 71/00* (2023.02); *H10K 59/1201* (2023.02); *H10K 77/10* (2023.02)

(58) Field of Classification Search
CPC .... H10K 50/844; H10K 71/00; H10K 59/124; H10K 59/1201; H10K 77/10
See application file for complete search history.

(56) References Cited

U.S. PATENT DOCUMENTS

| 2013/0227471 A1* | 8/2013 | Cha ....................... G06F 3/0484 715/790 |
| 2014/0009403 A1* | 1/2014 | Tremblay ............ G06F 3/04886 345/173 |

(Continued)

FOREIGN PATENT DOCUMENTS

| CN | 108649057 A | 10/2018 |
| CN | 110114884 A | 8/2019 |

(Continued)

OTHER PUBLICATIONS

First Office Action in the Chinese Patent Application No. 202011438605.0 dated Mar. 21, 2022; English translation attached.

*Primary Examiner* — Michael Lebentritt
(74) *Attorney, Agent, or Firm* — Intellectual Valley Law, P.C.

(57) ABSTRACT

The present application provides a fabricating method of a displaying base plate, a displaying base plate and a displaying device, wherein the displaying base plate includes a tapping region, an edge region surrounding the tapping region and a displaying region surrounding the edge region, and the displaying base plate within the edge region includes: a substrate base plate, and a planarization layer provided on one side of the substrate base plate; and a spacer wall and an organic functional layer that are provided on one side of the planarization layer that is further away from the substrate base plate, wherein the organic functional layer is partitioned on sides of the spacer wall; wherein a material of the spacer wall includes a photoinduced deformed material that has had an expansive deformation and a cross-linking reaction.

16 Claims, 12 Drawing Sheets

(51) Int. Cl.
*H10K 59/124* (2023.01)
*H10K 71/00* (2023.01)
*H10K 77/10* (2023.01)

(56) References Cited

U.S. PATENT DOCUMENTS

| | | |
|---|---|---|
| 2020/0144535 A1 | 5/2020 | Kim |
| 2020/0258959 A1 | 8/2020 | Mao et al. |
| 2021/0028255 A1 | 1/2021 | Gong et al. |
| 2021/0135122 A1 | 5/2021 | Yan et al. |
| 2022/0207764 A1* | 6/2022 | Liao ................... H04N 23/959 |
| 2022/0283684 A1* | 9/2022 | Zhang ................ H04M 1/0241 |

FOREIGN PATENT DOCUMENTS

| | | | | |
|---|---|---|---|---|
| CN | 110289291 A | 9/2019 | | |
| CN | 110379839 A | 10/2019 | | |
| EP | 3025218 B1 * | 6/2019 | ......... | G06F 3/03547 |

\* cited by examiner

FABRICATING METHOD OF DISPLAYING BASE PLATE, DISPLAYING BASE PLATE AND DISPLAYING DEVICE

The application claims priority to Chinese Patent Application No. 202011438605.0, entitled "FABRICATING METHOD OF DISPLAYING BASE PLATE, DISPLAYING BASE PLATE AND DISPLAYING DEVICE", filed with the China National Intellectual Property Administration on Dec. 10, 2020, which is incorporated herein by reference in its entirety.

TECHNICAL FIELD

The present disclosure relates to the technical field of displaying, and particularly relates to a fabricating method of a displaying base plate, a displaying base plate and a displaying device.

BACKGROUND

With the development of the industry of organic light emitting diode (referred to for short as OLED) display panels, large size, large visual angle and full screen have gradually become research hotspots. The full screen refers to a display screen having an ultrahigh screen-to-body ratio. The screen-to-body ratio of the ideal full screen is 100%; in other words, the whole of the front face of the mobile phone is the displaying interface. However, as restricted by the requirements of the installation of the indispensable basic functional components of a mobile phone such as the front-facing camera, the earphone, the human-face recognition sensor and the light sensor, it is required to leave a certain notch at the upper part of the mobile-phone screen to install the functional components, whereby display screens such as "bang screen" and "waterdrop screen" are formed.

With the progressive development of full screens, consumers have become dissatisfied with designs such as "bang screen" and "waterdrop screen", and accordingly display panels having a hole appear. As shown in FIG. 1, the hole 00 may be used to place functional components such as the camera, thereby increasing the utilization ratio of the screen.

SUMMARY

The present disclosure provides a fabricating method of a displaying base plate, a displaying base plate and a displaying device.

The present disclosure discloses a displaying base plate, wherein the displaying base plate comprises a tapping region, an edge region surrounding the tapping region and a displaying region surrounding the edge region, and the displaying base plate within the edge region comprises:
  a substrate base plate, and a planarization layer provided on one side of the substrate base plate; and
  a spacer wall and an organic functional layer that are provided on one side of the planarization layer that is further away from the substrate base plate, wherein the organic functional layer is partitioned on sides of the spacer wall;
  wherein a material of the spacer wall comprises a photoinduced deformed material that has had an expansive deformation and a cross-linking reaction.

In an optional implementation, the displaying base plate within the edge region further comprises:
  a cathode layer and a packaging layer that are provided in stack on sides of the spacer wall and the organic functional layer that are further away from the substrate base plate, wherein the cathode layer is provided closer to the substrate base plate, and the cathode layer and the packaging layer are partitioned on sides of the spacer wall.

In an optional implementation, a height of protrusion of the spacer wall from the packaging layer is greater than or equal to 0.5 micrometer and less than or equal to 2 micrometers.

In an optional implementation, the planarization layer comprises an embankment part and a planarization part, and the spacer wall is provided on sides of both of the embankment part and the planarization part that are further away from the substrate base plate.

In an optional implementation, the embankment part surrounds the tapping region, and, in the direction of the surrounding of the tapping region by the embankment part, the shape of the cross-section of the embankment part is a regular trapezoid.

In an optional implementation, the photoinduced deformed material comprises at least one of a light-sensitive liquid-crystal elastomer, a light-sensitive material having photoinduced stress relief and a PLZT ceramic material.

In an optional implementation, the photoinduced deformed material comprises an azophenyl polymer, and a molecular weight of the azophenyl polymer is greater than or equal to 5000 and less than or equal to 8000.

In an optional implementation, the organic functional layer comprises one or more of a hole injection layer, a hole transporting layer, an electron transporting layer and an electron injection layer that are provided in stack.

The present disclosure further discloses a displaying device, wherein the displaying device comprises the displaying base plate according to any one of the above embodiments.

The present disclosure further discloses a fabricating method of a displaying base plate, wherein the displaying base plate comprises a tapping region, an edge region surrounding the tapping region and a displaying region surrounding the edge region, and the fabricating method of the displaying base plate within the edge region comprises:
  providing a substrate base plate;
  forming a planarization layer on one side of the substrate base plate; and
  forming a spacer wall and an organic functional layer on one side of the planarization layer that is further away from the substrate base plate, wherein the organic functional layer is partitioned on sides of the spacer wall, and a material of the spacer wall comprises a photoinduced deformed material that has had an expansive deformation and a cross-linking reaction.

In an optional implementation, the step of forming the spacer wall and the organic functional layer on the one side of the planarization layer that is further away from the substrate base plate comprises:
  forming a spacer rod on one side of the planarization layer that is further away from the substrate base plate, wherein a material of the spacer rod comprises a photoinduced deformed material;
  forming an organic functional layer on sides of the planarization layer and the spacer rod that are further away from the substrate base plate; and
  irradiating the spacer rod by using a light ray of a specified wavelength, to cause the spacer rod to deform, to form the spacer wall.

In an optional implementation, before the step of irradiating the spacer rod by using the light ray of a specified wavelength, the method further comprises:

forming sequentially a cathode layer and a packaging layer on one side of the organic functional layer that is further away from the substrate base plate;

wherein the spacer wall partitions the cathode layer and the packaging layer on sides of the spacer wall.

In an optional implementation, the step of forming the spacer rod on the one side of the planarization layer that is further away from the substrate base plate comprises:

spread-coating a precursor-solution thin film on the one side of the planarization layer that is further away from the substrate base plate;

performing high-temperature solidifying treatment to the precursor-solution thin film, to form an isolating film layer; and by using a patterning process, treating the isolating film layer, to form the spacer rod;

wherein the precursor solution comprises the photoinduced deformed material.

In an optional implementation, the photoinduced deformed material is an azophenyl polymer, and the precursor solution further comprises: a crosslinking agent, a prepolymer monomer, a hardener, an initiator, an additive and a solvent.

In an optional implementation, a height of the spacer rod is greater than or equal to 3 micrometers and less than or equal to 10 micrometers.

In an optional implementation, the spacer rod surrounds the tapping region, and, in a direction of the surrounding of the tapping region by the spacer rod, a size of an orthographic projection of a cross-section of the spacer rod on the substrate base plate is greater than or equal to 10 micrometers and less than or equal to 50 micrometers.

In an optional implementation, the step of irradiating the spacer rod by using the light ray of a specified wavelength, to cause the spacer rod to deform, to form the spacer wall comprises:

irradiating the spacer rod by using the light ray of a specified wavelength, to cause the spacer rod to deform; and heating the spacer rod that has deformed, to cause the photoinduced deformed material to have a cross-linking reaction, to form the spacer wall.

The above description is only an overview of the technical solution of this disclosure, which can be implemented according to the contents of the specification in order to understand the technical means of this disclosure more clearly, and in order to make the above and other objects, features and advantages of this disclosure more obvious and understandable, the detailed description of this disclosure will be given below.

BRIEF DESCRIPTION OF THE DRAWINGS

In order to more clearly illustrate the technical solutions of the embodiments of the present disclosure, the figures that are required to describe the embodiments of the present disclosure will be briefly introduced below. Apparently, the figures that are described below are embodiments of the present disclosure, and a person skilled in the art can obtain other figures according to these figures without paying creative work.

DETAILED DESCRIPTION

In order to make the above purposes, features and advantages of the present disclosure more apparent and understandable, the present disclosure will be described in further detail below with reference to the drawings and the particular embodiments.

Figure 1:
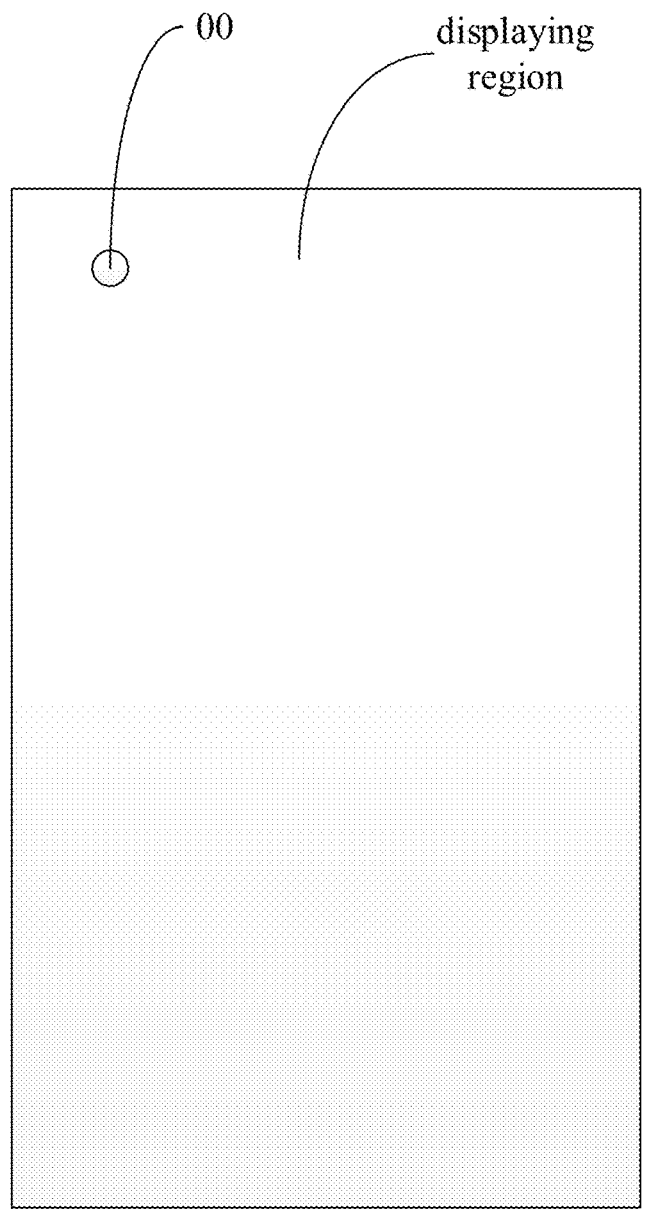
FIG. 1 shows a schematic planar structural diagram of a displaying base plate in the related art.
Figure 2:
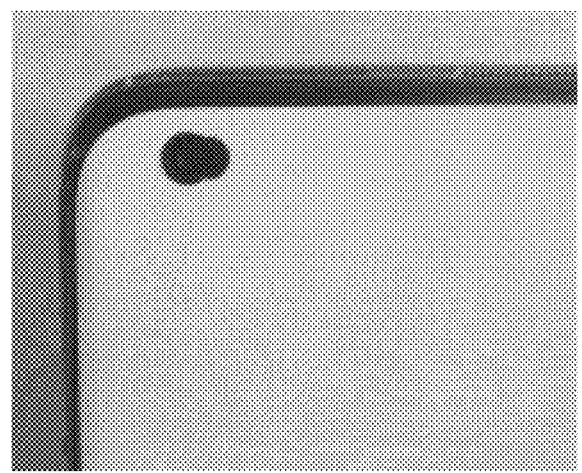
FIG. 2 shows a diagram of a product having black-spot imperfect in the related art.

Taking a mobile phone product as an example, after the user has obtained the mobile phone, the screen appears as a gourd screen, as shown in FIG. 2. The gourd screen results from that an approximately circular black-spot region is formed around the tapping region of the screen, and that region, when connected with the tapping region, seems like the shape of a gourd, which is called jokingly as a gourd screen. The gourd screen is a black-spot imperfect, and is a problem of packaging failure specific to OLEDs. The black-spot imperfect results from that the organic-luminescent-material layer is very sensitive to water and oxygen, the organic-material layer is exposed at the edge of the tapping region, and water vapor and oxygen enter the displaying region via the exposed organic-material layer, whereby the luminescent material at part of the displaying region is oxidized, which results in failure in the light emission, and generates black-spot imperfect. The formation of the black-spot imperfect may be completed within hours, and may also be completed within days. Therefore, some mobile phones have the black-spot imperfect upon starting-up, but, in most of mobile phones, the black-spot imperfect does not exist at the beginning, and gradually appears under the influence of external factors (generally, pressure, water vapor and so on), which results in a poor reliability of the products. Therefore, how to effectively block the path of the transferring of water vapor and oxygen to the displaying region via the organic-material layer is a technical difficult problem in the art that is required to be solved urgently.

Figure 3:
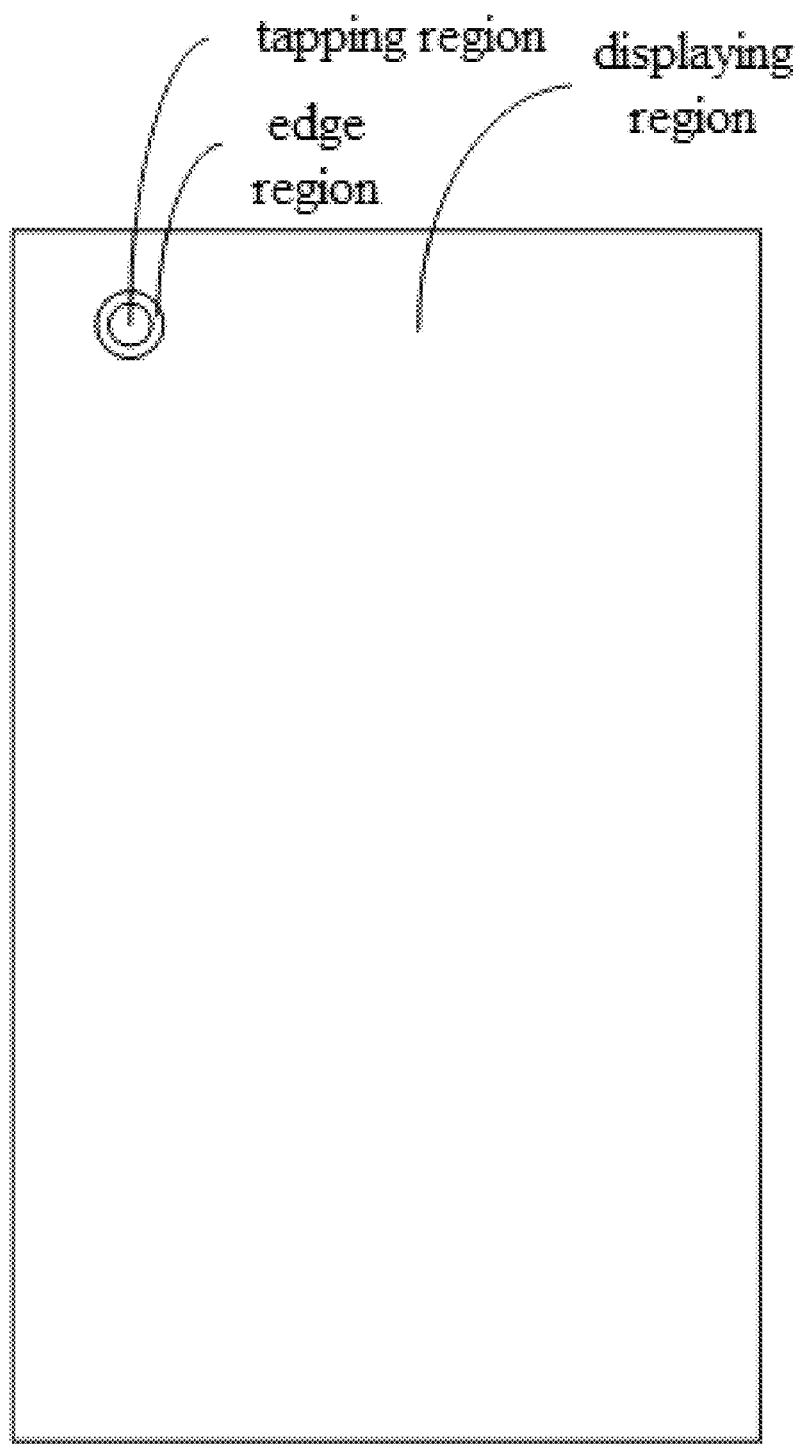
FIG. 3 shows a schematic planar structural diagram of the displaying base plate according to an embodiment of the present application.

In order to solve the above problems, an embodiment of the present application provides a displaying base plate. Referring to FIG. 3, FIG. 3 shows a schematic planar structural diagram of the displaying base plate according to the present embodiment, wherein the displaying base plate comprises a tapping region, an edge region surrounding the tapping region and a displaying region surrounding the edge region.

Figure 4:
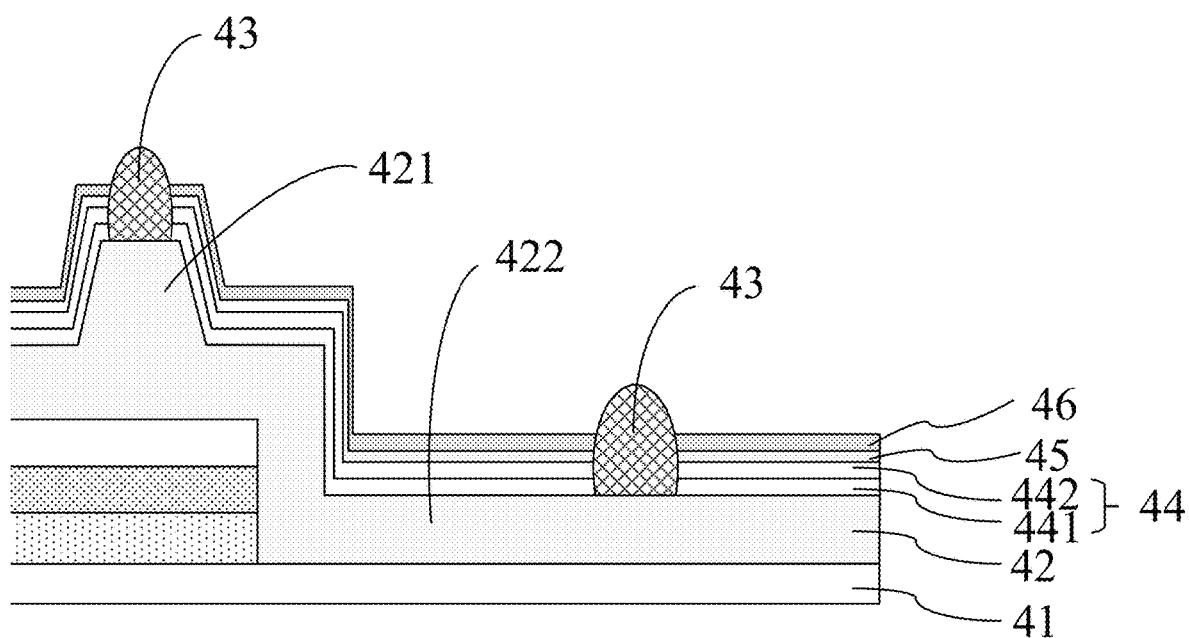
FIG. 4 shows a schematic sectional structural diagram of the edge region of the displaying base plate according to an embodiment of the present application.

Referring to FIG. 4, FIG. 4 shows a schematic sectional structural diagram of the edge region of the displaying base plate according to the present embodiment. The displaying base plate within the edge region comprises: a substrate base plate 41, and a planarization layer 42 provided on one side of the substrate base plate 41; and a spacer wall 43 and an organic functional layer 44 that are provided on one side of the planarization layer 42 that is further away from the substrate base plate 41, wherein the organic functional layer 44 is partitioned on sides of the spacer wall 43; wherein the material of the spacer wall 43 comprises a photoinduced deformed material that has had an expansive deformation and a cross-linking reaction.

The substrate base plate 41 may be, for example, a glass base plate and so on.

The planarization layer 42 may be, for example, materials such as polyimide, silica gel and acrylics.

The organic functional layer 44 may comprise one or more of a hole injection layer (HIL), a hole transporting layer (HTL), an electron transporting layer (ETL) and an electron injection layer (EIL) that are provided in stack. In the present embodiment, the organic functional layer 44 comprises a hole injection layer (HIL), a hole transporting layer (HTL), an electron transporting layer (ETL) and an electron injection layer (EIL) that are provided in stack, wherein the hole injection layer (HIL) is provided closer to the planarization layer 42. In order to simplify the description, in FIG. 4, the hole injection layer (HIL) and the hole transporting layer (HTL) are illustrated as one layer, i.e., a film layer 441, and the electron transporting layer (ETL) and the electron injection layer (EIL) are illustrated as one layer, i.e., a film layer 442.

Figure 5:
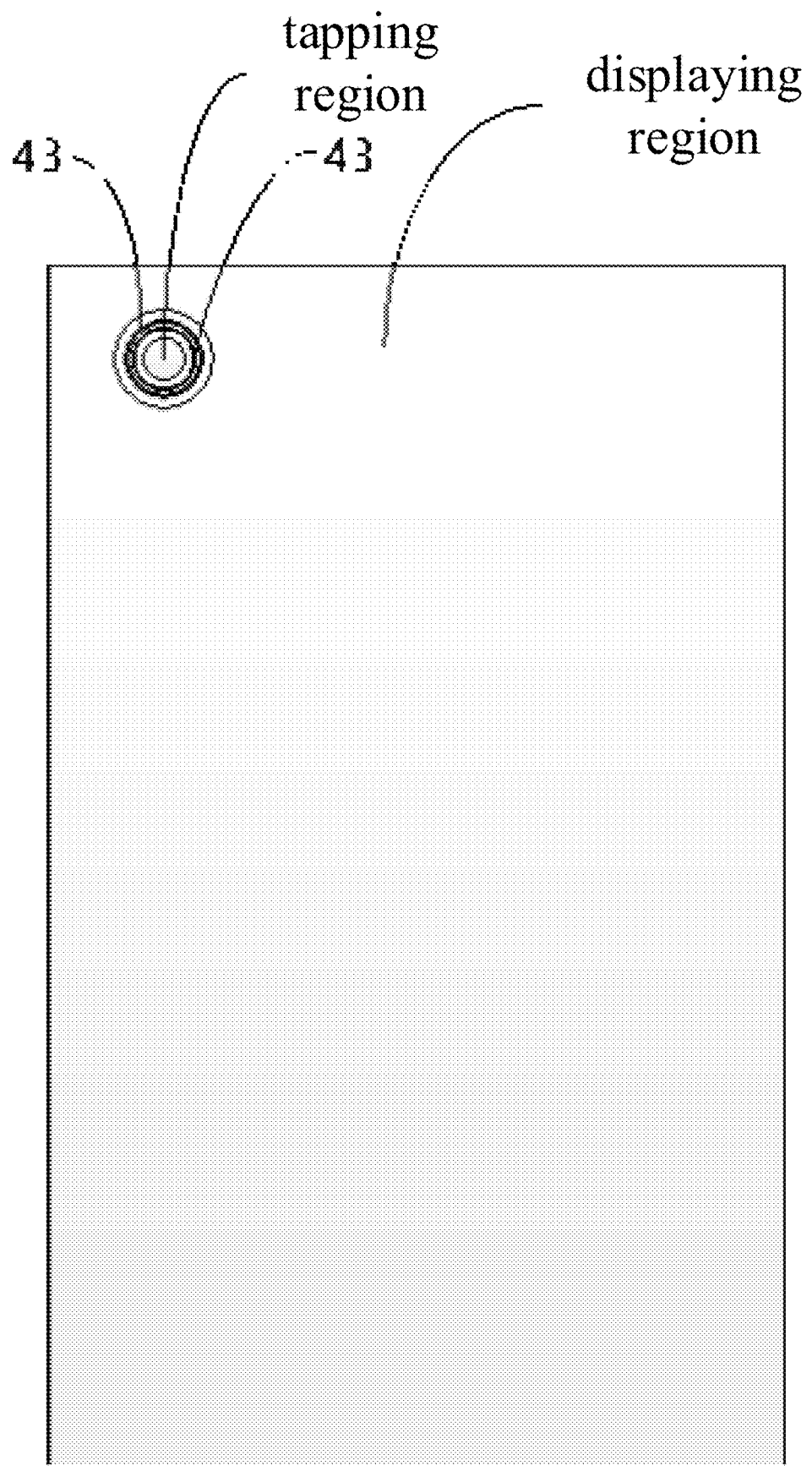
FIG. 5 shows a schematic planar structural diagram of the displaying base plate according to an embodiment of the present application.

The spacer wall 43 may be a closed structure that surrounds the tapping region and is head-tail connected, as shown in FIG. 5. The spacer wall 43 provided in the edge region may be one or more spacer walls 43; for example, in the edge region shown in FIG. 5 are provided two spacer walls 43.

The photoinduced deformed material is a novel function material. When irradiated by a light of specific wavelength and intensity (for example, a laser), the interior of the material has a photophysical or photochemical effect, to convert the light energy into mechanical energy, to have a stretching deformation. When the irradiation of the specific wavelength and intensity disappears, for example, in an environment of natural light, the deformation of the photoinduced deformed material recovers.

Figure 6:
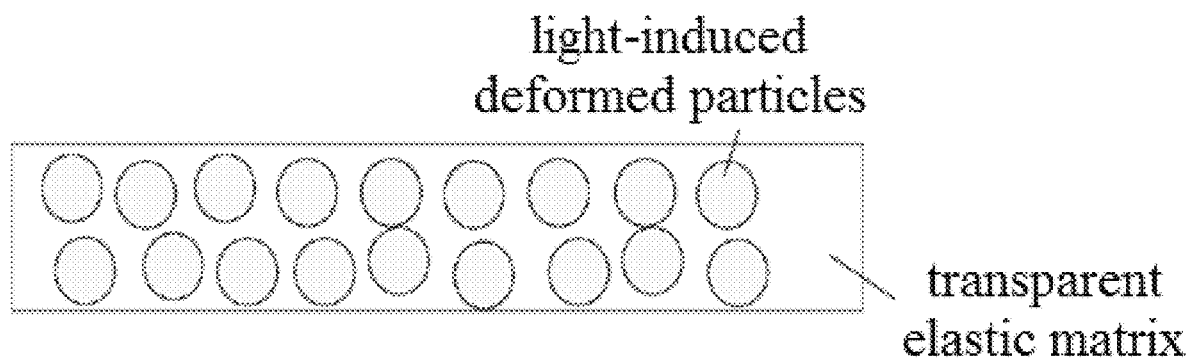
FIG. 6 shows a photoinduced-deformed-thin-film structure according to an embodiment of the present application.

FIG. 6 shows a photoinduced-deformed-thin-film structure. As shown in FIG. 6, light-induced deformed particles are distributed in a transparent elastic matrix. When irradiated by a light of a specific wavelength and certain intensity, the light-induced deformed particles at the irradiated region convert the light energy into mechanical energy, and the transparent elastic matrix has a stretching deformation, thereby enabling the thin film to have a stretching deformation. When the irradiation disappears, the deformation of the thin film recovers. Therefore, the photoinduced deformed material can realize accurate and quick light driving, and have the characteristic of recoverable and repeatable driving.

Because the material of the spacer wall 43 comprises the photoinduced deformed material that has had an expansive deformation and a cross-linking reaction, or, in other words, the spacer wall 43 is formed by the photoinduced deformed material, the shape of the spacer wall 43 can be accurately controlled by controlling the duration of the irradiation on the photoinduced deformed material. In addition, the photoinduced deformed material that has had the cross-linking reaction can have a fixed shape, and cannot have mass transfer any more, thereby obtaining the spacer wall 43 having a stable shape.

The cross-linking reaction may be realized by high-temperature annealing. High-temperature annealing can enable the photoinduced deformed material to have a reaction of free-radical polymerization under the effect of an initiator and a crosslinking agent, thereby enabling the formation of a polymer network system having a superhigh crosslinking degree inside the photoinduced deformed material, to fix the shape of the photoinduced deformed material.

In the displaying base plate according to the present embodiment, the spacer wall can partition the organic functional layer on the two sides of the spacer wall, i.e., isolating thoroughly the organic functional layer located on the one side of the spacer wall that is closer to the tapping region and the organic functional layer located on the one side of the spacer wall that is closer to the displaying region, thereby blocking the channel of the transferring of water vapor and oxygen to the displaying region via the organic functional layer, to prevent black-spot imperfect, to improve the yield and the reliability of the display product. In addition, because the material of the spacer wall comprises the photoinduced deformed material that has had an expansive deformation and a cross-linking reaction, the controllability and the stability of the shape of the spacer wall can be ensured.

In a particular implementation, the material having the photoinduced deforming effect has various examples. For example, the photoinduced deformed material may comprise one or more of a light-sensitive liquid-crystal elastomer, a light-sensitive material having photoinduced stress relief and a PLZT ceramic material.

Figure 7:
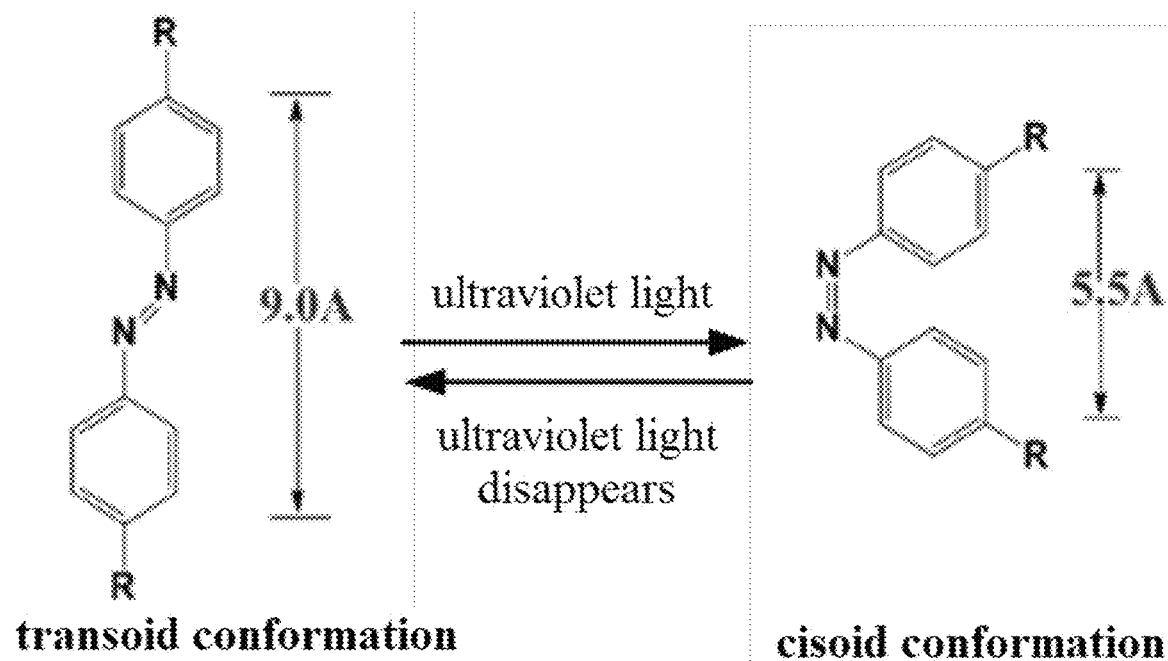
FIG. 7 shows a diagram of the reaction principle of the deformation of the azophenyl polymer according to an embodiment of the present application.

In the present embodiment, the photoinduced deformed material may comprise, for example, an azophenyl polymer (Poly-Azo). The azophenyl polymer has two conformations, i.e., a cisoid conformation and a transoid conformation. The transoid conformation is more stable, but is transformed into the cisoid conformation under the effect of ultraviolet light, as shown in FIG. 7. The molecular length of the transoid conformation of the azophenyl polymer is approximately 0.9 nm, and the molecular length of the cisoid conformation is approximately 0.55 nm. For the azophenyl polymer, under the irradiation of ultraviolet light, the transoid conformation can be efficiently transformed into the cisoid conformation, and, under heating or visible-light irradiation, the cisoid conformation can be completely reversibly transformed into the transoid conformation. The large amount of microscopic transformation in the polymer generally results in a macroscopic mass transfer. Therefore, by using the azophenyl polymer as the photoinduced deformed material, accurate and quick light driving can be realized, and it has the characteristic of recoverable and repeatable driving.

In the present embodiment, when the molecular weight of the azophenyl polymer is greater than or equal to 5000 and less than or equal to 8000, it has a good effect of deformation.

In a particular implementation, referring to FIG. 4, the fabrication may comprise firstly spread-coating one organic-photosensitive-resin film layer (for example, a photoresist) on the surface of the one side of the planarization layer 42 that is further away from the substrate base plate 41, wherein the organic-photosensitive-resin film layer may be doped by the photoinduced deformed material; subsequently, fabricating the spacer rod by using processes such as exposure and development; subsequently, covering the exposed planarization layer 42 and spacer rod with the organic functional layer 44; subsequently, by irradiating the spacer rod by using a light ray of a specific wavelength, enabling it to have an expansive deformation, wherein during the expansive deformation, the organic functional layer 44 is applied an upward expansive pulling force, whereby the organic functional layer 44 is broken on the two sides of the expanded spacer rod; and subsequently, performing high-temperature annealing to the spacer rod obtained after the expansive deformation, to enable it to have a cross-linking reaction, thereby obtaining the photoinduced deformed material that has had an expansive deformation and a cross-linking reaction, to form the spacer wall.

In an optional implementation, referring to FIG. 4, the displaying base plate within the edge region may further comprise: a cathode layer 45 and a packaging layer 46 that are provided in stack on the sides of the spacer wall 43 and the organic functional layer 44 that are further away from the substrate base plate 41, wherein the cathode layer 45 is provided closer to the substrate base plate 41, and the cathode layer 45 and the packaging layer 46 are partitioned on sides of the spacer wall 43.

In a particular implementation, the fabrication may comprise forming the cathode layer 45 and the packaging layer 46 sequentially in stack on the one side of the organic functional layer 44 that is further away from the substrate base plate 41; subsequently, by irradiating the spacer rod by using a light ray of a specific wavelength, enabling it to have an expansive deformation, wherein during the expansive deformation, the organic functional layer 44, the cathode layer 45 and the packaging layer 46 are applied an upward expansive pulling force, whereby the organic functional layer 44, the cathode layer 45 and the packaging layer 46 are broken on the two sides of the expanded spacer rod; and subsequently, performing high-temperature annealing to the spacer rod obtained after the expansive deformation, to enable it to have a cross-linking reaction, thereby obtaining the photoinduced deformed material that has had an expansive deformation and a cross-linking reaction, to form the spacer wall.

In a particular implementation, the packaging layer 46 may comprise a first inorganic packaging layer, an organic layer and a second inorganic packaging layer. The first inorganic packaging layer and the second inorganic packaging layer are used to prevent the water vapor and the oxygen that enter from the front face of the display panel from entering the organic functional layer 44. The materials of the first inorganic packaging layer and the second inorganic packaging layer are inorganic substances, such as silicon nitride and/or silicon oxide. The organic layer is used to prevent the inorganic-substance particles in the first inorganic packaging layer from affecting the fabrication of the second inorganic packaging layer, which results in the cracking of the film layer of the second inorganic packaging layer. Therefore, it is required to provide the organic layer to planarize the first inorganic packaging layer. The material of the organic layer may be, for example, acrylics.

In the present implementation, the spacer wall can partition the organic functional layer, the cathode layer and the packaging layer on the two sides of the spacer wall, i.e., isolating thoroughly the organic functional layer, the cathode layer and the packaging layer located on the one side of the spacer wall that is closer to the tapping region and the organic functional layer, the cathode layer and the packaging layer located on the one side of the spacer wall that is closer to the displaying region, thereby blocking thoroughly the channel of the transferring of water vapor and oxygen to the displaying region, to prevent black-spot imperfect, and further improve the yield and the reliability of the display product.

In an optional implementation, the height of protrusion of the spacer wall 43 from the packaging layer 46 may be greater than or equal to 0.5 micrometer and less than or equal to 2 micrometers.

In an optional implementation, referring to FIG. 4, the planarization layer 42 comprises an embankment part 421 and a planarization part 422, and the spacer wall 43 is provided on the sides of both of the embankment part 421 and the planarization part 422 that are further away from the substrate base plate 41.

The embankment part 421 may surround the tapping region, and, in the direction of the surrounding of the tapping region by the embankment part 421, the shape of the cross-section (the section shown in FIG. 4) of the embankment part 421 may be a regular trapezoid.

Because the material of the organic functional layer 44 has certain fluidity, the embankment part 421 can block the material of the organic functional layer 44 from flowing toward the one side closer to the tapping region, to prevent the material of the organic functional layer 44 from diffusing toward the tapping region.

It should be noted that the spacer wall 43 provided at the embankment part 421 is not necessary, as long as the spacer wall 43 is provided within the edge region. Its particular position may be determined according to practical demands, and is not limited in the present embodiment.

Figure 8:
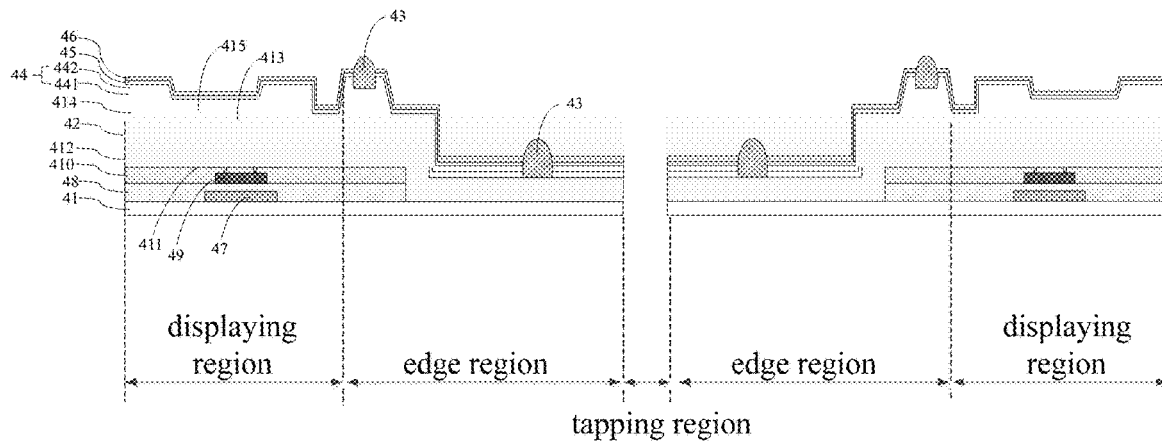
FIG. 8 shows a schematic sectional structural diagram of the displaying base plate according to an embodiment of the present application.

Referring to FIG. 8, FIG. 8 shows a schematic sectional structural diagram of a displaying base plate according to the present embodiment. In order to simplify the description, in FIG. 8, the hole injection layer (HIL) and the hole transporting layer (HTL) are illustrated as one layer, i.e., a film layer 441, and the electron transporting layer (ETL) and the electron injection layer (EIL) are illustrated as one layer, i.e., a film layer 442. In practical applications, the hole injection layer (HIL), the hole transporting layer (HTL), the electron transporting layer (ETL) and the electron injection layer (EIL) may commonly cover the anodes of the sub-pixel units and a pixel defining layer, in which case the hole injection layer, the hole transporting layer, the electron transporting layer and the electron injection layer may be defined as a common layer.

Another embodiment of the present application further provides a displaying device, wherein the displaying device comprises the displaying base plate according to any one of the above embodiments.

It should be noted that the displaying device according to the present embodiment may be any products or components that have the function of 2D or 3D displaying, such as a display panel, an electronic paper, a mobile phone, a tablet personal computer, a TV set, a notebook computer, a digital photo frame and a navigator.

Figure 9:
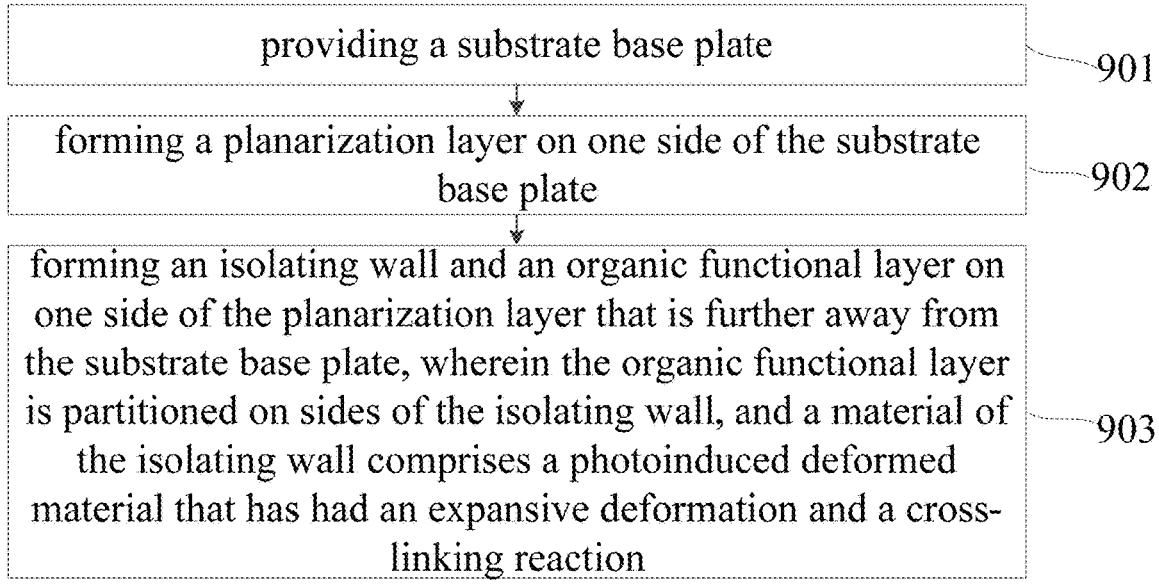
FIG. 9 shows a flow chart of the fabricating method of a displaying base plate according to an embodiment of the present application.

Another embodiment of the present application further provides a fabricating method of a displaying base plate. Referring to FIG. 3, the displaying base plate comprises a tapping region, an edge region surrounding the tapping region and a displaying region surrounding the edge region. Referring to FIG. 9, the fabricating method of the displaying base plate within the edge region comprises:

Step 901: providing a substrate base plate 41.

Step 902: forming a planarization layer 42 on one side of the substrate base plate 41.

Step 903: forming a spacer wall 43 and an organic functional layer 44 on one side of the planarization layer 42 that is further away from the substrate base plate 41, wherein the organic functional layer 44 is partitioned on sides of the spacer wall 43, and the material of the spacer wall 43 comprises a photoinduced deformed material that has had an expansive deformation and a cross-linking reaction.

Referring to FIG. 4, FIG. 4 shows a schematic sectional structural diagram of the displaying base plate that is fabricated by using the fabricating method according to the present embodiment. By using the fabricating method according to the present embodiment, the displaying base plate according to any one of the above embodiments can be obtained. The particular structure and effect of the displaying base plate may refer to the description on the above embodiments, and are not discussed herein further.

Figure 10:
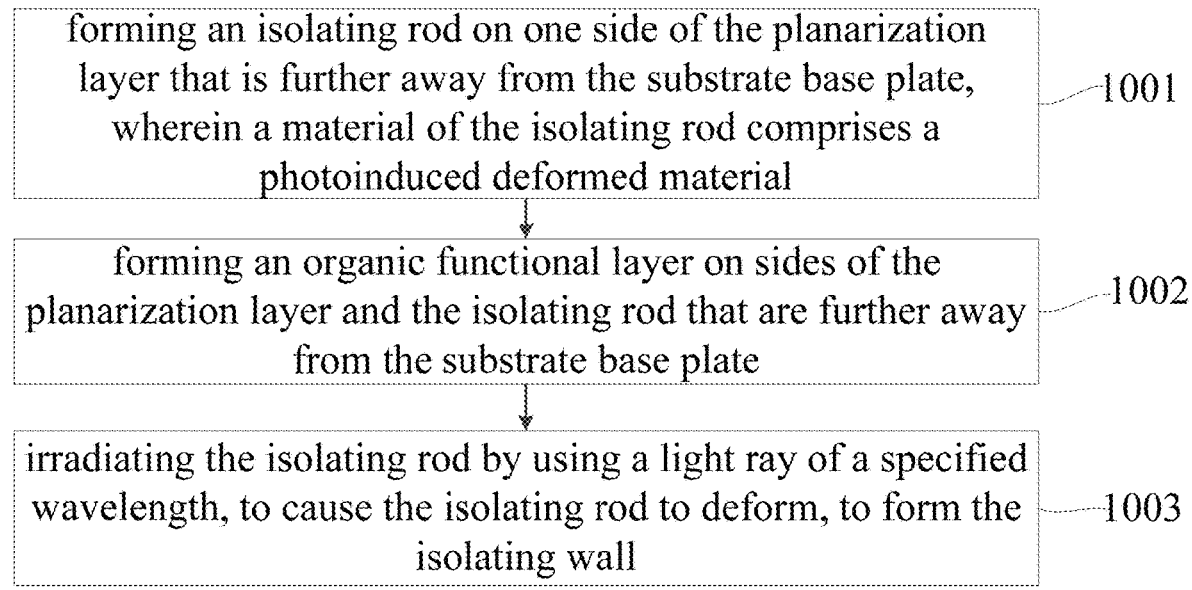
FIG. 10 shows a flow chart of the fabricating method of the spacer wall according to an embodiment of the present application.
Figure 14:
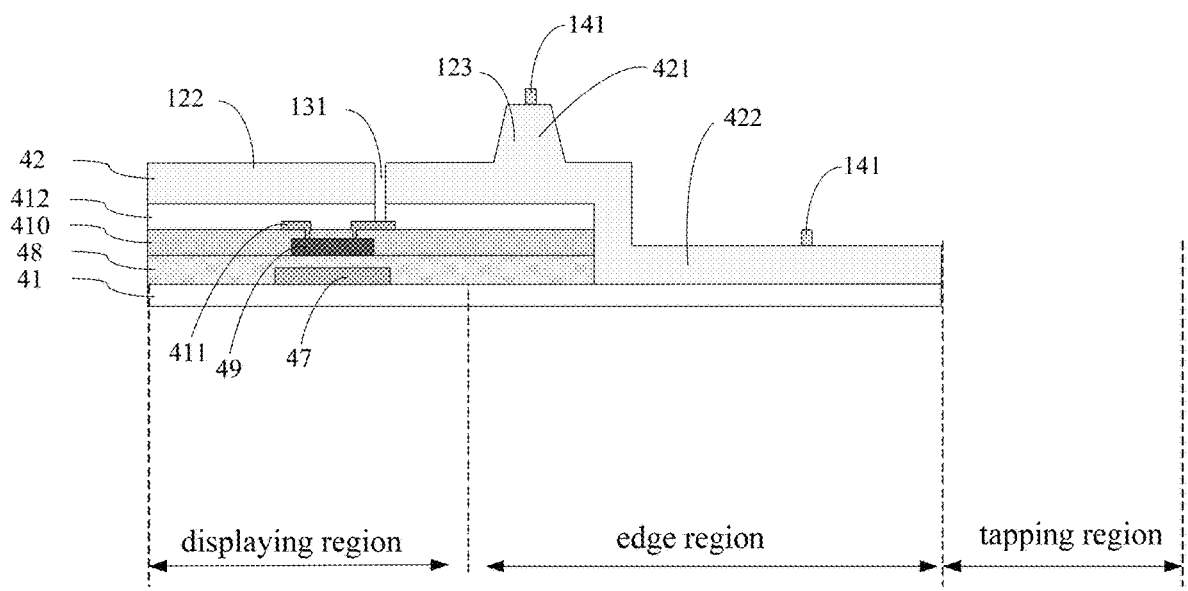
FIG. 14 shows a schematic sectional structural diagram of the displaying base plate according to an embodiment of the present application, in which the fabrication of the spacer rod has been completed.

In an optional implementation, referring to FIG. 10, the step 903 may particularly comprise:

Step 1001: forming a spacer rod 141 on one side of the planarization layer 42 that is further away from the substrate base plate 41, referring to FIG. 14, wherein the material of the spacer rod 141 comprises a photoinduced deformed material.

In a particular implementation, this step may comprise firstly spread-coating a precursor-solution thin film on the one side of the planarization layer 42 that is further away from the substrate base plate 41; sequentially performing high-temperature solidifying treatment to the precursor-solution thin film, to form an isolating film layer; and sequentially, by using a patterning process, treating the isolating film layer, to form the spacer rod 141; wherein the precursor solution comprises the photoinduced deformed material, the photoinduced deformed material may be an azophenyl polymer, and the precursor solution may further comprise: a crosslinking agent, a prepolymer monomer, a hardener, an initiator, an additive and a solvent.

Step 1002: forming the organic functional layer 44 on the sides of the planarization layer 42 and the spacer rod 141 that are further away from the substrate base plate 41.

Step 1003: irradiating the spacer rod 141 by using a light ray of a specified wavelength, to cause the spacer rod 141 to deform, to form the spacer wall 43.

In a particular implementation, this step may comprise firstly irradiating the spacer rod 141 by using a light ray of a specified wavelength, to cause the spacer rod 141 to deform; and subsequently heating the spacer rod 141 that has deformed, to cause the photoinduced deformed material to have a cross-linking reaction, to form the spacer wall 43.

Before the step 1003, the method may further comprise: forming sequentially a cathode layer 45 and a packaging layer 46 on the one side of the organic functional layer 44 that is further away from the substrate base plate 41; wherein the spacer wall 43 partitions the cathode layer 45 and the packaging layer 46 on sides of the spacer wall 43.

The above steps will be described in detail below by taking the fabrication process of the entire displaying base plate as an example.

Step 1: providing the substrate base plate 41, and fabricating a thin-film TFT structure on the substrate base plate 41 within the displaying region.

Particularly, a metal grid 47 is fabricated on the substrate base plate 41, and its material may be Cu/Al/Ag/Ti and so on. A grid insulating layer 48 is fabricated on the metal grid 47, and its material may be silicon oxide or silicon nitride and so on, or a laminated-layer structure of them, an active layer 49 is fabricated on the grid insulating layer 48, and its material may be IGZO or a low-temperature polycrystalline silicon and so on. An inter-layer-medium layer 410 is fabricated on the active layer 49, and its material may be silicon oxide or silicon nitride and so on, or a laminated-layer structure of them; and a metal source-drain electrode 411 is fabricated on the inter-layer-medium layer 410, the metal source-drain electrode 411 is electrically connected to the active layer 49 by a via hole in the inter-layer-medium layer 410, and its material may be Cu/Al/Ag/Ti and so on. A passivation protection layer 412 is fabricated on the metal source-drain electrode 411, to protect the TFT under it, and its material may be silicon oxide or silicon nitride and so on, or a laminated-layer structure of them. Accordingly, the displaying base plate shown in FIG. 11 can be fabricated.

Figure 11:
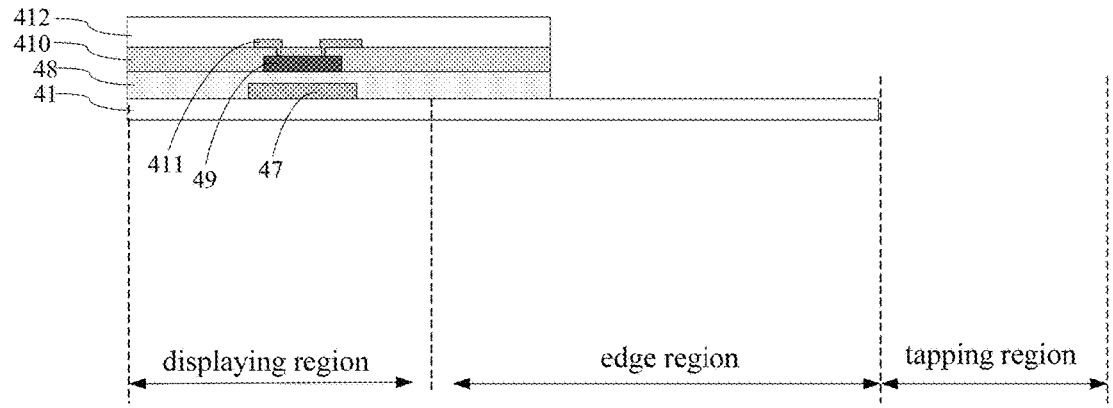
FIG. 11 shows a schematic sectional structural diagram of the substrate base plate according to an embodiment of the present application.
Figure 12:
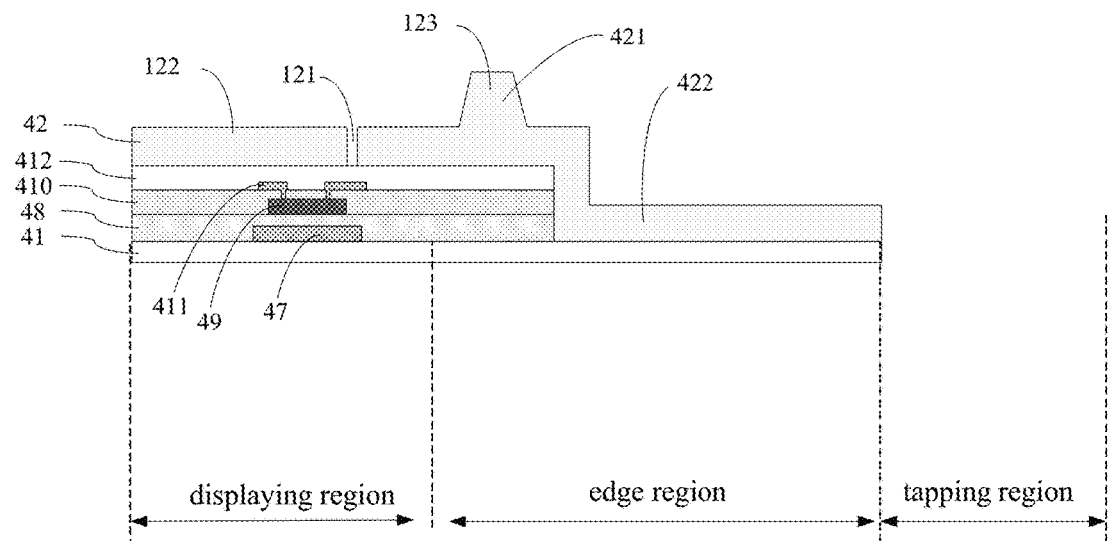
FIG. 12 shows a schematic sectional structural diagram of the displaying base plate according to an embodiment of the present application, in which the fabrication of the planarization layer has been completed.

Step 2: spread-coating a light-sensitive organic film layer (for example, a positive photoresist) on the displaying region and the edge region of the displaying base plate shown in FIG. 11, and, by using the technique of halftone mask, fabricating the planarization layer 42. The planarization layer 42 comprises three parts, i.e., a completely exposed region 121, a partially exposed region 122 and an unexposed region 123. Within the completely exposed region 121, a via hole 121 penetrating the planarization layer 42 may be formed. The partially exposed region 122 is located on the two sides of the unexposed region 123. Because the positive organic film material is used, the embankment part 421 having a cross section of the shape of a regular trapezoid may be formed within the unexposed region 123. Referring to FIG. 12, FIG. 12 shows a schematic sectional structural diagram of the displaying base plate in which the fabrication of the planarization layer has been completed. Because the material of the organic layer has certain fluidity, the embankment part 421 may be used to block the material of the organic layer from flowing toward the one side closer to the tapping region, to prevent the material of the organic layer from diffusing toward the tapping region.

Figure 13:
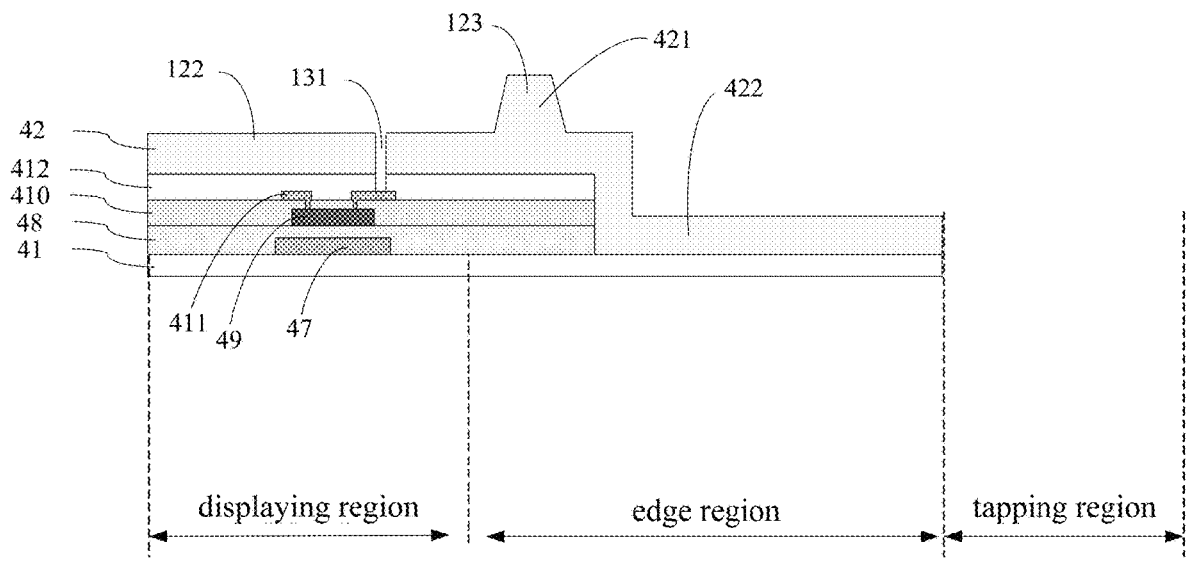
FIG. 13 shows a schematic sectional structural diagram of the displaying base plate according to an embodiment of the present application, in which the tapping of the passivation protection layer has been completed.

Step 3: by using the planarization layer 42 as the etching protection layer, etching the passivation protection layer 412 at the bottom of the via hole 121 in the planarization layer 42, to obtain a via hole 131 penetrating the planarization layer 42 and the passivation protection layer 412, wherein the bottom of the via hole 131 is the upper surface of the a metal drain, as shown in FIG. 13.

Step 4: spread-coating one organic-photosensitive-resin film layer (for example, a photoresist) on the surface of the planarization layer 42, wherein the organic-photosensitive-resin film layer is doped by the photoinduced deformed material, and, by exposure and development, fabricating the spacer rod 141 located on the embankment part 421 and the planarization part 422, as shown in FIG. 14.

The photoinduced deformed material may be an organic composite material that is added a photo-responsive compound (for example, an azobenzene compound). In the present embodiment, the photoinduced deformed material may be an azophenyl polymer (Poly-Azo). Azobenzene has two conformations, i.e., a cisoid conformation and a transoid conformation. The transoid conformation is more stable, but is transformed into the cisoid conformation under the effect of ultraviolet light, as shown in FIG. 7. The molecular length of the transoid conformation of azobenzene is approximately 0.9 nm, and that of the cisoid conformation is 0.55 nm. When a polymer molecule chain contains multiple azobenzene structures, the large amount of microscopic transformation generally results in a macroscopic mass transfer of the azophenyl polymer material.

Figure 15:
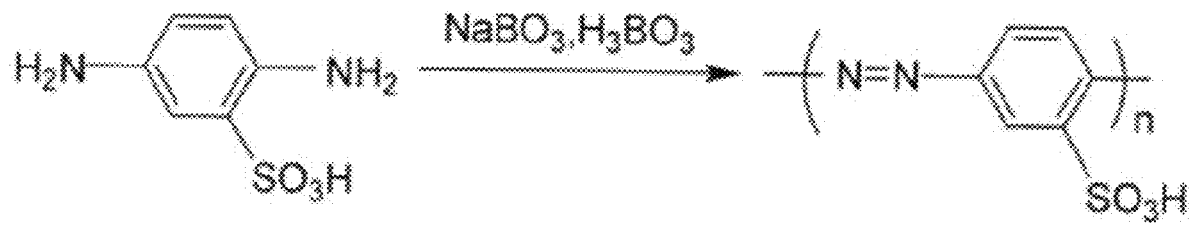
FIG. 15 shows a schematic diagram of the principle of the preparation of the azophenyl polymer according to an embodiment of the present application.

Referring to FIG. 15, FIG. 15 shows a diagram of the principle of the preparation of an azophenyl polymer. Into a reaction vessel of a nitrogen atmosphere is added quantitative 2,5-diaminobenzenesulfonic acid, and it is dissolved completely in ethanol. Under the catalysis of minute amounts of sodium borate and boric acid, an oxidative coupling reaction happens to generate a conjugated azophenyl polymer. That synthesizing method has a high conversion rate of above 70%. After the reaction has completed, the azophenyl polymer is collected by using a precipitation method. During the precipitation, the stirring duration may be controlled at 6-48 hours. By using the fabricating method, azophenyl polymers of the molecular weights of 1000-1000 can be synthesized. The present embodiment may employ the azophenyl polymer of the molecular weight of 5000-8000.

The organic-photosensitive-resin film layer doped by the photoinduced deformed material is a composite material based on the azobenzene polymer, and its components may include: a crosslinking agent, a prepolymer monomer, the azophenyl polymer (Poly-Azo), a hardener, a photosensitizer, an initiator, an additive and a solvent. The crosslinking agent is the commonly used epoxy polyacrylate. The prepolymer monomer is a polyacrylate-substituted compound. The hardener is methylhexahydrophthalic anhydride or another acid anhydride compound. The initiator is isopropyl benzene hydroperoxide or another peroxy compound. The solvent is the mixed solvent of propylene glycol methyl ether acetate and glycol dimethyl ether. In addition, in order to improve the levelling property of the material, the additive is a polyether-polyester-modified organosiloxane.

In a particular implementation, the precursor-solution thin film of the organic-photosensitive-resin film layer may be firstly spread-coated on the planarization layer 42, wherein the components of the precursor solution may include: the crosslinking agent, the prepolymer monomer, the hardener, the azophenyl polymer (Poly-Azo), the initiator, the additive and the solvent. After the precursor-solution thin film has been completely spread-coated, it may be treated at a high temperature of 110° C. for 20-40 min, to solidify to form the isolating film layer.

Subsequently, patterning processes such as exposure and development may be performed to the isolating film layer, to fabricate the spacer rod 141. It should be noted that the spacer rod 141 located at the edge region may be one or more spacer rods 141.

The height of the spacer rod 141 may be greater than or equal to 3 micrometers and less than or equal to 10 micrometers. In other words, the thickness of the spacer rod 141 is 3-10 micrometers.

The spacer rod 141 may be a closed structure that surrounds the tapping region and is head-tail connected, and, in the direction of the surrounding of the tapping region by the spacer rod 141, the size of the orthographic projection of the cross-section of the spacer rod 141 on the substrate base plate 41 may be greater than or equal to 10 micrometers and less than or equal to 50 micrometers. In other words, the width in the normal direction of the spacer rod 141 is 10-50 μm, wherein the normal direction of the spacer rod 141 refers to the direction perpendicular to the spacer rod 141 and surrounding the tapping region.

Figure 16:
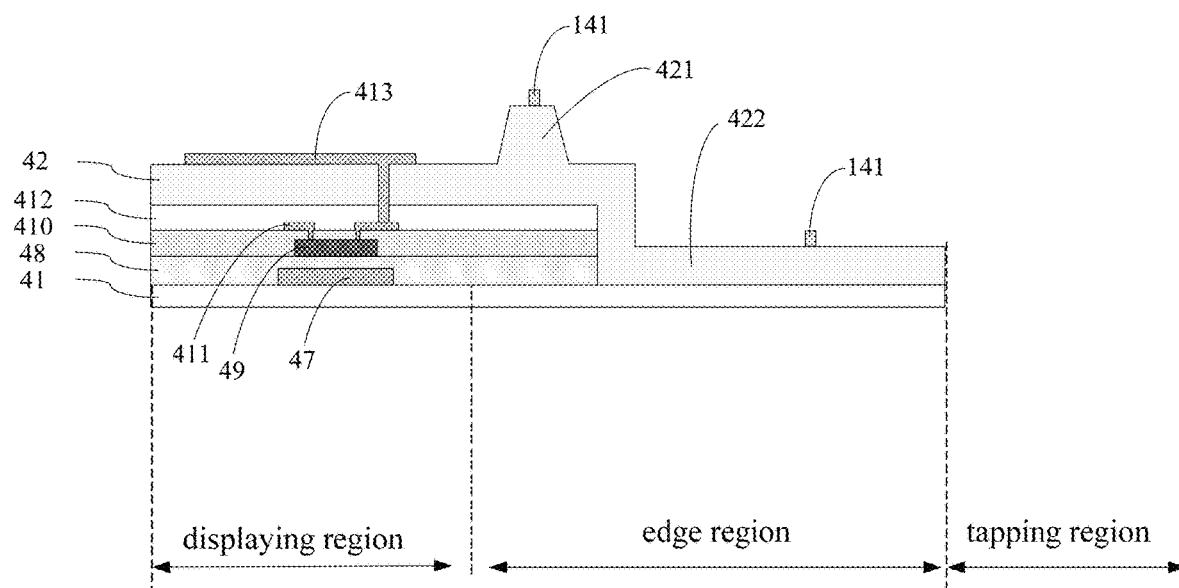
FIG. 16 shows a schematic sectional structural diagram of the displaying base plate according to an embodiment of the present application, in which the fabrication of the anode has been completed.

Step 5: in the displaying region of the displaying base plate shown in FIG. 14, by using processes such as film coating, exposure and etching, fabricating the anode 413 of the OLED, wherein the anode 413 is electrically connected to the metal drain by the via hole 131. Referring to FIG. 16, FIG. 16 shows a schematic sectional structural diagram of the displaying base plate in which the fabrication of the anode has been completed. The material of the anode 413 is a transparent electrically conductive thin-film material having a high work function such as ITO and ZnO, and, generally, a reflecting metal layer is fabricated at the bottom of the anode 413, for example Al/Ag and so on, so as to fabricate an OLED structure of a top emission type.

Figure 17:
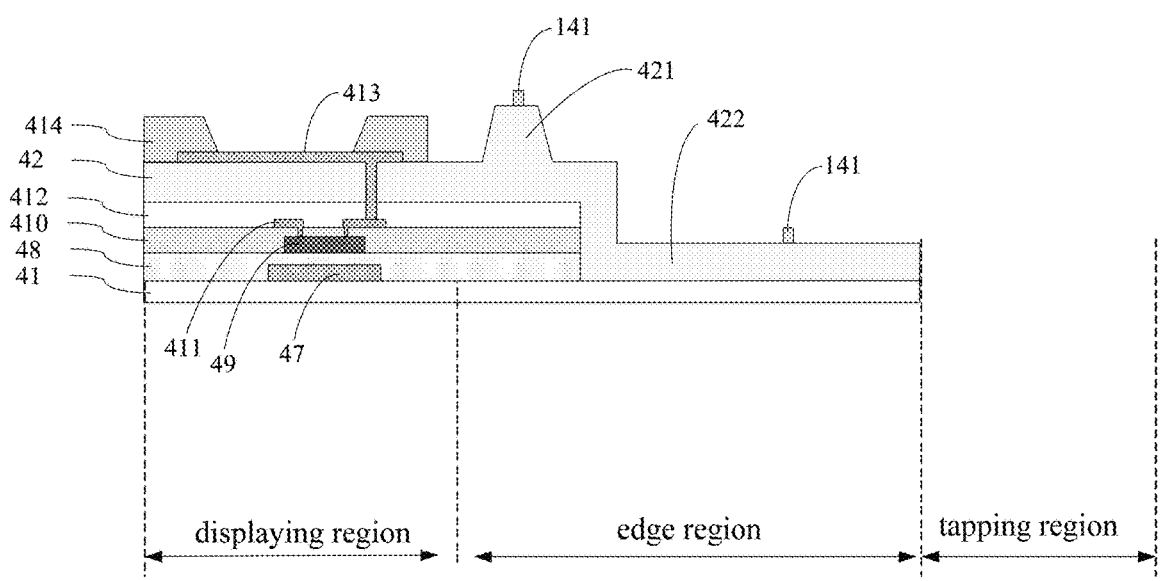
FIG. 17 shows a schematic sectional structural diagram of the displaying base plate according to an embodiment of the present application, in which the fabrication of the pixel defining layer has been completed.

Step 6: by using the steps such as spread-coating a light-sensitive organic film (for example, a photoresist), exposure and development, fabricating a pixel defining layer 414 of an organic material, wherein the embankment part of the pixel defining layer 414 surrounds the light emitting region, the subsequent organic light emitting film layers are fabricated in the depression of the pixel defining layer 414, and the pixel defining layer 414 can function to insulate the anode 413 of the OLED. Referring to FIG. 17, FIG. 17 shows a schematic sectional structural diagram of the displaying base plate in which the fabrication of the pixel defining layer has been completed.

Figure 18:
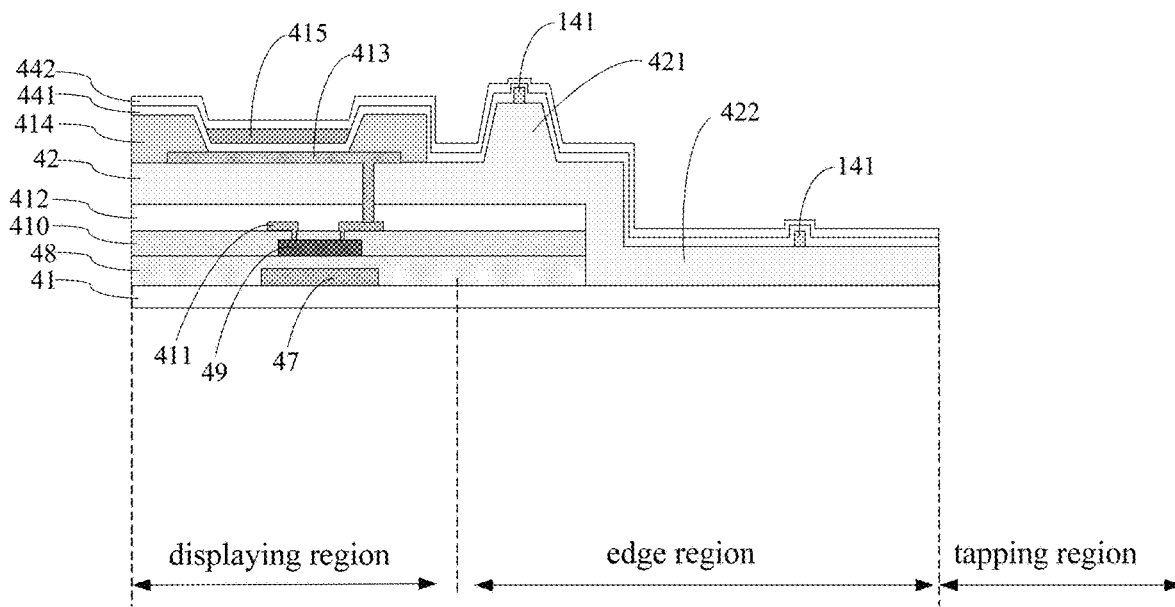
FIG. 18 shows a schematic sectional structural diagram of the displaying base plate according to an embodiment of the present application, in which the fabrication of the organic functional layer has been completed.

Step 7: after the pixel defining layer 414 has been completely fabricated, vapor-depositing the hole injection layer and the hole transporting layer on the displaying base plate shown in FIG. 17 by vapor deposition, and, subsequently, by using a vapor-deposition mask, vapor-depositing sequentially the R, B, G organic-luminescent-material layers 415 within different sub-pixel regions, and continuing to fabricate by vapor deposition the electron transporting layer and the electron injection layer over the R, B, G organic-luminescent-material layers 415. Referring to FIG. 18, FIG. 18 shows a schematic sectional structural diagram of the displaying base plate in which the fabrication of the hole injection layer, the hole transporting layer, the organic-luminescent-material layer, the electron transporting layer and the electron injection layer has been completed. In order to simplify the description, in FIG. 18, the hole injection layer and the hole transporting layer are illustrated as one layer, i.e., a film layer 441, and the electron transporting layer and the electron injection layer are illustrated as one layer, i.e., a film layer 442.

Figure 19:
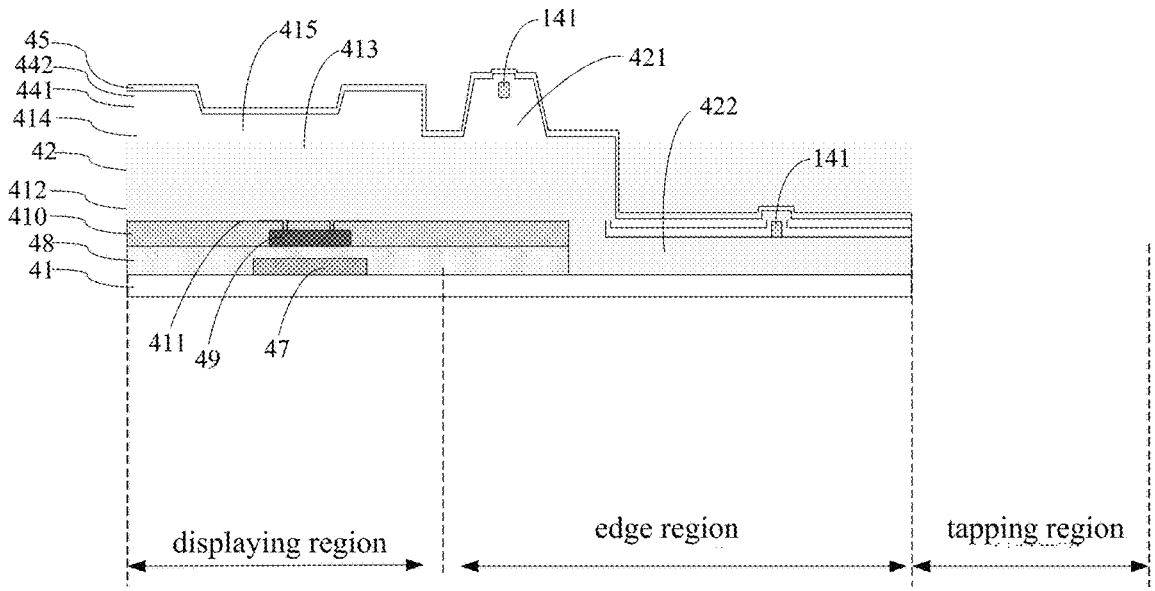
FIG. 19 shows a schematic sectional structural diagram of the displaying base plate according to an embodiment of the present application, in which the fabrication of the cathode layer has been completed.

Step 8: by vapor deposition or another mode, fabricating a transparent cathode layer 45 of the OLED pixel units on the displaying base plate shown in FIG. 18. Referring to FIG. 19, FIG. 19 shows a schematic sectional structural diagram of the displaying base plate in which the fabrication of the cathode layer has been completed.

Figure 20:
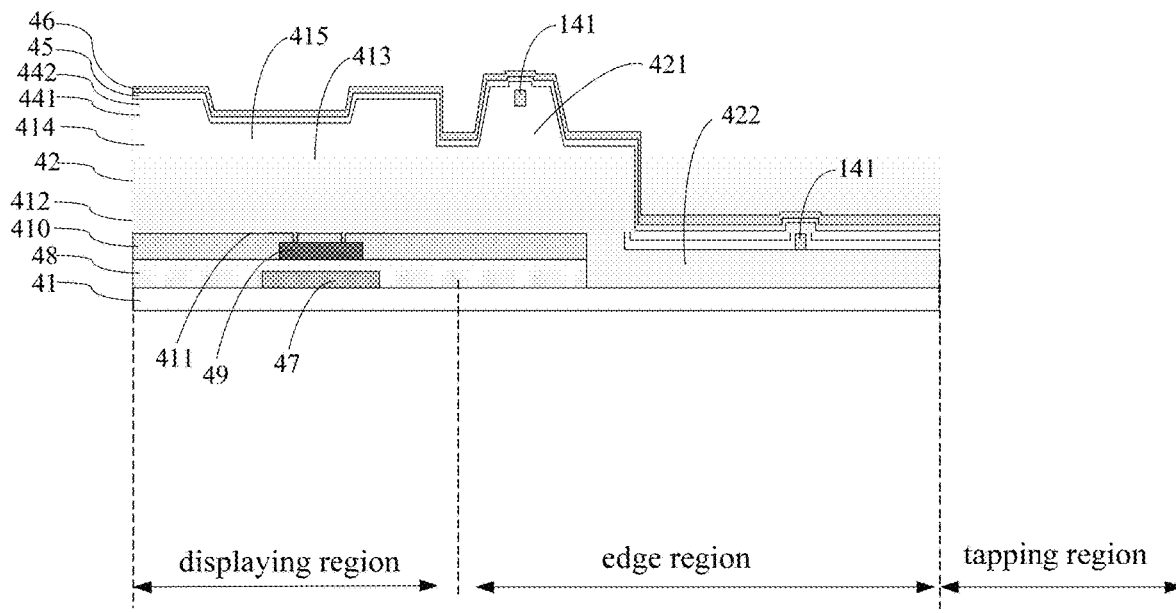
FIG. 20 shows a schematic sectional structural diagram of the displaying base plate according to an embodiment of the present application, in which the fabrication of the packaging layer has been completed.

Step 9: fabricating the packaging layer 46, wherein the packaging layer 46 may comprise a first inorganic packaging layer, an organic layer and a second inorganic packaging layer, and the first inorganic packaging layer and the second inorganic packaging layer are used to prevent the water vapor and the oxygen that enter from the front face of the display panel from entering the light emitting functional layer. The materials of the first inorganic packaging layer and the second inorganic packaging layer are inorganic substances, such as silicon nitride and/or silicon oxide. The organic layer is used to prevent the inorganic-substance particles in the first inorganic packaging layer from affecting the fabrication of the second inorganic packaging layer, which results in the cracking of the film layer of the second inorganic packaging layer. Therefore, it is required to provide the organic layer to planarize the first inorganic packaging layer. The material of the organic layer may be, for example, acrylics. Referring to FIG. 20, FIG. 20 shows a schematic sectional structural diagram of the displaying base plate in which the fabrication of the packaging layer has been completed.

Figure 21:
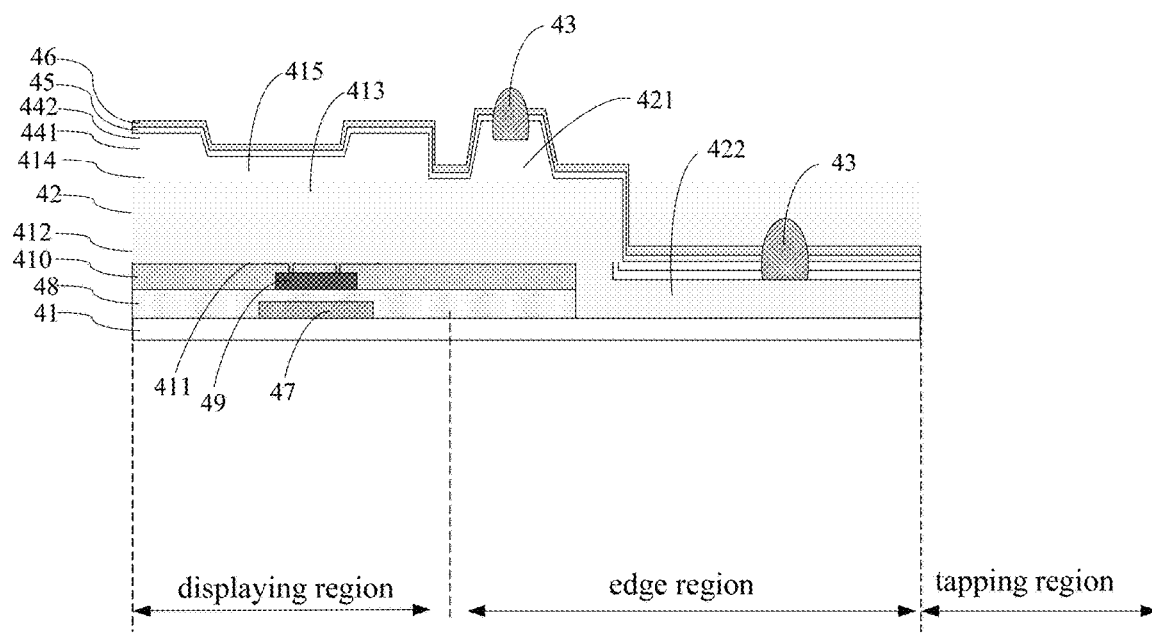
FIG. 21 shows a schematic sectional structural diagram of the displaying base plate according to an embodiment of the present application, in which the fabrication of the spacer wall has been completed.

Step 10: after the OLED displaying base plate has been packaged completely, before the laser cutting of the tapping region, irradiating the spacer rod 141 by using an ultraviolet light of a specific wavelength (dominant wavelength 365 nm), to cause it to deform into the spacer wall 43, as shown in FIG. 21.

Figure 22:
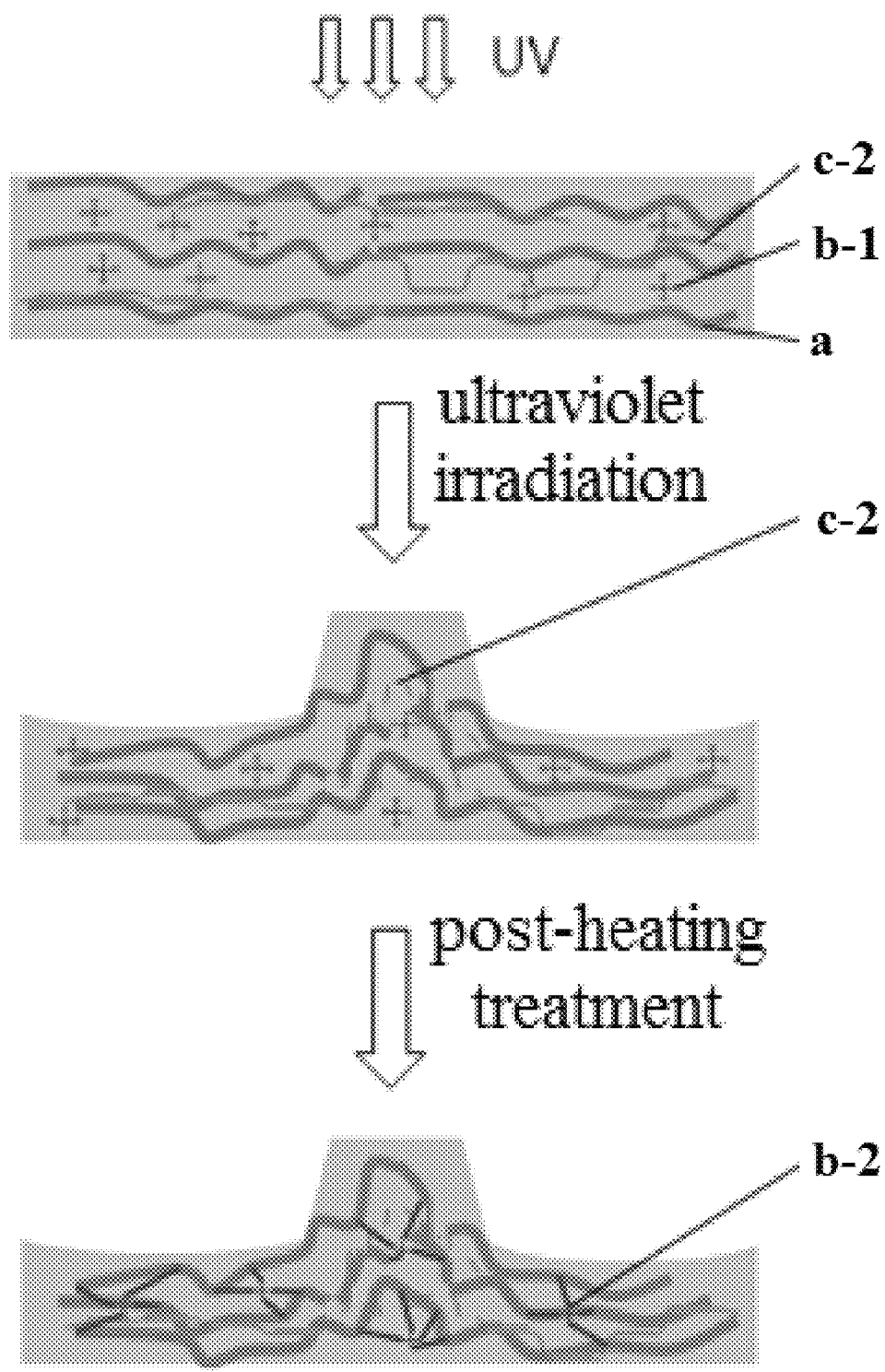
FIG. 22 shows a schematic diagram of the principle of forming the spacer wall from the spacer rod according to an embodiment of the present application.

The organic-photosensitive-resin film layer doped by the photoinduced deformed material according to the present embodiment contains a polyazobenzene (Poly-azo) compound c of the molecular weight of 5000-8000. After the compound has been irradiated by the ultraviolet light, referring to FIG. 22, conformation transformation (transoid conformation c-1→cisoid conformation c-2) happens at the molecular chain backbone of the polyazobenzene, and the molecular chain contracts, driving the peripheral Monomer-a molecular chain to have peristalsis, thereby resulting in mass transfer of the irradiated region of the film layer, the macroscopic phenomenon of which is expressed as the increase in the film thickness of the spacer rod 141. After the ultraviolet-light irradiation has been completed, the film layer is delivered into a post-heating device. The post-heating temperature is controlled at 180° C.-200° C., and the duration is controlled at 20-25 min. During the post-heating, the monomers in the material of the organic-photosensitive-resin film layer doped by the photoinduced deformed material, under the effect of the initiator and the crosslinking agent b, start to have a reaction of free-radical polymerization, thereby enabling the formation of a polymer network system having a superhigh crosslinking degree in the whole material. The material that has had the cross-linking reaction has already had a fixed shape, and cannot have mass transfer any more, thereby ensuring the shape stability of the spacer wall 43.

In the process during which the spacer rod 141 has the expansive deformation and forms the spacer wall 43, the film layers (for example, the organic functional layer, the cathode layer and the packaging layer) located over the spacer rod 141 are applied an upward expansive pulling force, whereby those film layers crack on the two sides of the spacer wall. Furthermore, after the post-heating, the cracked organic film layers flow back and collapse downwardly, whereby the film layers on the two sides of the spacer wall can be completely isolated.

Step 11: by using a laser, cutting along the edge of the tapping region, to obtain the displaying base plate. Referring to FIG. 8, FIG. 8 shows a schematic sectional structural diagram of the displaying base plate that has been completely fabricated.

The spacer wall provided at the edge region can block the organic material from flowing toward the one side closer to the tapping region, to prevent the organic material from diffusing toward the tapping region. Furthermore, the spacer wall can also isolate thoroughly the organic functional layer, the cathode layer and the packaging layer closer to the tapping region and the organic functional layer, the cathode layer and the packaging layer closer to the displaying region, to block the channel of the transferring of water vapor and oxygen, to prevent black-spot imperfect.

In the fabricating method according to the present embodiment, the spacer rod is fabricated on the planarization layer. The material of the spacer rod comprises a photoinduced deformed material, and the photoinduced deformed material is an organic composite material that is added a photo-responsive compound (an azobenzene compound). The spacer rod may be one or more spacer rods provided at the edge region. After the displaying base plate has been packaged completely, the spacer rod is scanned and irradiated by using a laser of a specific wavelength, to cause it to deform and protrude, and, in the step of post-heating, the crosslinking agent in the spacer rod material has the cross-linking reaction at the high temperature, thereby forming the spacer wall of a fixed appearance. The spacer wall partitions the film layer structure located on its two sides, so as to partition the film layer closer to the displaying region and the film layer closer to the tapping region on the two sides of the spacer wall, thereby blocking the channel of the transferring of water vapor and oxygen, to prevent black-spot imperfect, and improve the yield of the product.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The fabricating method of the displaying base plate, the displaying base plate and the displaying device according to the present disclosure has been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. A displaying base plate, wherein the displaying base plate comprises a tapping region, an edge region surrounding the tapping region and a displaying region surrounding the edge region, and the displaying base plate within the edge region comprises:
    a substrate base plate, and a planarization layer provided on one side of the substrate base plate; and
    a spacer wall and an organic functional layer that are provided on one side of the planarization layer that is further away from the substrate base plate, wherein the organic functional layer is partitioned on sides of the spacer wall;
    wherein a material of the spacer wall comprises a photoinduced deformed material that has had an expansive deformation and a cross-linking reaction;
    wherein the planarization layer comprises an embankment part and a planarization part, and the spacer walls are provided on sides of both of the embankment part and the planarization part that are further away from the substrate base plate.

2. The displaying base plate according to claim 1, wherein the displaying base plate within the edge region further comprises:
    a cathode layer and a packaging layer that are provided in stack on sides of the spacer wall and the organic functional layer that are further away from the substrate base plate, wherein the cathode layer is provided closer to the substrate base plate, and the cathode layer and the packaging layer are partitioned on sides of the spacer wall.

3. The displaying base plate according to claim 2, wherein a height of protrusion of the spacer wall from the packaging layer is greater than or equal to 0.5 micrometer and less than or equal to 2 micrometers.

4. The displaying base plate according to claim 1, wherein the embankment part surrounds the tapping region, and, in a direction of the surrounding of the tapping region by the embankment part, a shape of a cross-section of the embankment part is a regular trapezoid.

5. The displaying base plate according to claim 1, wherein the photoinduced deformed material comprises at least one of a light-sensitive liquid-crystal elastomer, a light-sensitive material having photoinduced stress relief and a PLZT ceramic material.

6. The displaying base plate according to claim 5, wherein the photoinduced deformed material comprises an azophe-nyl polymer, and a molecular weight of the azophenyl polymer is greater than or equal to 5000 and less than or equal to 8000.

7. The displaying base plate according to claim 1, wherein the organic functional layer comprises one or more of a hole injection layer, a hole transporting layer, an electron transporting layer and an electron injection layer that are provided in stack.

8. A displaying device, wherein the displaying device comprises the displaying base plate according to claim 1.

9. A fabricating method of a displaying base plate, wherein the displaying base plate comprises a tapping region, an edge region surrounding the tapping region and a displaying region surrounding the edge region, and the fabricating method of the displaying base plate within the edge region comprises:
    providing a substrate base plate;
    forming a planarization layer on one side of the substrate base plate; and
    forming a spacer wall and an organic functional layer on one side of the planarization layer that is further away from the substrate base plate, wherein the organic functional layer is partitioned on sides of the spacer wall, and a material of the spacer wall comprises a photoinduced deformed material that has had an expansive deformation and a cross-linking reaction;
    wherein the planarization layer comprises an embankment part and a planarization part, and the spacer walls are provided on sides of both of the embankment part and the planarization part that are further away from the substrate base plate.

10. The fabricating method according to claim 9, wherein the step of forming the spacer wall and the organic functional layer on the one side of the planarization layer that is further away from the substrate base plate comprises:
    forming a spacer rod on one side of the planarization layer that is further away from the substrate base plate, wherein a material of the spacer rod comprises a photoinduced deformed material;
    forming an organic functional layer on sides of the planarization layer and the spacer rod that are further away from the substrate base plate; and
    irradiating the spacer rod by using a light ray of a specified wavelength, to cause the spacer rod to deform, to form the spacer wall.

11. The fabricating method according to claim 10, wherein before the step of irradiating the spacer rod by using the light ray of a specified wavelength, the method further comprises:
    forming sequentially a cathode layer and a packaging layer on one side of the organic functional layer that is further away from the substrate base plate;
    wherein the spacer wall partitions the cathode layer and the packaging layer on sides of the spacer wall.

12. The fabricating method according to claim 10, wherein the step of forming the spacer rod on the one side of the planarization layer that is further away from the substrate base plate comprises:
    spread-coating a precursor solution thin film on the one side of the planarization layer that is further away from the substrate base plate;
    performing high-temperature solidifying treatment to the precursor solution thin film, to form an isolating film layer; and
    by using a patterning process, treating the isolating film layer, to form the spacer rod;

wherein the precursor solution comprises the photoinduced deformed material.

13. The fabricating method according to claim 12, wherein the photoinduced deformed material is an azophenyl polymer, and the precursor solution further comprises: a crosslinking agent, a prepolymer monomer, a hardener, an initiator, an additive and a solvent.

14. The fabricating method according to claim 10, wherein a height of the spacer rod is greater than or equal to 3 micrometers and less than or equal to 10 micrometers.

15. The fabricating method according to claim 10, wherein the spacer rod surrounds the tapping region, and, in a direction of the surrounding of the tapping region by the spacer rod, a size of an orthographic projection of a cross-section of the spacer rod on the substrate base plate is greater than or equal to 10 micrometers and less than or equal to 50 micrometers.

16. The fabricating method according to claim 10, wherein the step of irradiating the spacer rod by using the light ray of a specified wavelength, to cause the spacer rod to deform, to form the spacer wall comprises:
  irradiating the spacer rod by using the light ray of a specified wavelength, to cause the spacer rod to deform; and
  heating the spacer rod that has deformed, to cause the photoinduced deformed material to have a cross-linking reaction, to form the spacer wall.

* * * * *